United States Patent
Lee

(10) Patent No.: US 9,419,632 B1
(45) Date of Patent: Aug. 16, 2016

(54) CHARGE PUMP FOR USE IN PHASE-LOCKED LOOP

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/135,942

(22) Filed: Apr. 22, 2016

(51) Int. Cl.
- H03L 7/06 (2006.01)
- H03L 7/089 (2006.01)
- H02M 3/07 (2006.01)

(52) U.S. Cl.
CPC .............. *H03L 7/0898* (2013.01); *H02M 3/07* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,208,546 A * | 5/1993 | Nagaraj | ................... | H03L 7/107 327/157 |
| 7,184,510 B2 * | 2/2007 | Jung | ..................... | H03L 7/0896 327/157 |
| 7,202,718 B2 * | 4/2007 | Lindner | ................ | H03L 7/0893 327/148 |
| 7,312,645 B1 * | 12/2007 | Brunn | ................... | H03L 7/0898 327/147 |
| 7,570,105 B1 * | 8/2009 | Baek | ..................... | H03L 7/0898 327/148 |
| 8,305,155 B2 * | 11/2012 | Yamaguchi | ............... | H03L 7/08 327/156 |
| 2007/0229129 A1 * | 10/2007 | Nakagawa | .............. | H03L 7/087 327/156 |
| 2015/0200768 A1 * | 7/2015 | Shibasaki | ............. | H03L 7/0807 375/355 |
| 2015/0214932 A1 * | 7/2015 | Tomita | ................... | H03K 3/017 327/156 |

* cited by examiner

*Primary Examiner* — Adam Houston
(74) *Attorney, Agent, or Firm* — McClure, Qualey & Rodack, LLP

(57) ABSTRACT

A charge pump includes a switching circuit, a constant current source, a constant current sink, an adaptive current source, and an adaptive current sink. The switching circuit generates an output voltage at an output node according to an up control signal and a down control signal. The constant current source supplies a first current to the switching circuit. The constant current sink draws a second current from the switching circuit. The adaptive current source supplies a third current to the switching circuit. The adaptive current sink draws a fourth current from the switching circuit. The third current and the fourth current are adjustable according to the up control signal and the down control signal.

15 Claims, 8 Drawing Sheets

CHARGE PUMP FOR USE IN PHASE-LOCKED LOOP

BACKGROUND OF THE INVENTION

1. Field of the Invention

The disclosure generally relates to a charge pump, and more specifically, to a charge pump for accelerating the locking process and reducing the phase error in a PLL (Phase-Locked Loop).

2. Description of the Related Art

A PLL (Phase-Locked Loop) is a control system that generates an output signal whose phase is related to the phase of an input signal. While there are several differing types, it is easy to initially visualize as an electronic circuit consisting of a variable frequency oscillator and a phase detector. The oscillator generates a periodic signal. The phase detector compares the phase of that signal with the phase of the input periodic signal and adjusts the oscillator to keep the phases matched. Bringing the output signal back toward the input signal for comparison is called a feedback loop since the output is "fed back" toward the input forming a loop.

FIG. 1 is a diagram of a conventional PLL 100 with an input node IN and an output node OUT. For example, the PLL 100 may include a phase frequency detector 110, a charge pump 120, a loop filter 130, a VCO (Voltage-Controlled Oscillator) 140, and a frequency divider 150 (optional). When the PLL 100 is locked, the frequency of a reference signal SREF (such as input clock signals) at the input node IN is the same as the frequency of a feedback signal SFB from the output node OUT. The conventional PLL 100 generally has the problem of having either a long locking time or serious jitter and phase error due to the poor design of the charge pump 120. Accordingly, there is a need to design a novel charge pump to overcome the drawbacks of the prior art.

BRIEF SUMMARY OF THE INVENTION

In a preferred embodiment, the disclosure is directed to a charge pump, including: a switching circuit, generating an output voltage at an output node according to an up control signal and a down control signal, wherein the output voltage is increased when the up control signal is at high voltage level and decreased when the down control signal is at high voltage level; a constant current source, supplying a first current to the switching circuit at a current supply node; a constant current sink, drawing a second current from the switching circuit at a current sink node; an adaptive current source, supplying a third current to the switching circuit at the current supply node; and an adaptive current sink, drawing a fourth current from the switching circuit at the current sink node; wherein the third current and the fourth current are adjustable according to the up control signal and the down control signal.

In some embodiments, the adaptive current source includes a fast-locking circuit supplying current to the switching circuit during a locking process of a phase-locked loop (PLL), and not supplying current to the switching circuit once the PLL is locked.

In some embodiments, the fast-locking circuit includes: a first low-pass filter, wherein the first low-pass filter has a first terminal for receiving the up control signal, and a second terminal for outputting the up control signal with reduced pulse width; a second low-pass filter, wherein the second low-pass filter has a first terminal for receiving an inverted down control signal, and a second terminal for outputting the inverted down control signal with reduced pulse width, wherein the inverted down control signal has a complementary logic level to that of the down control signal; a first NAND gate, wherein the first NAND gate has a first input terminal coupled to the second terminal of the first low-pass filter, a second input terminal coupled to the second terminal of the second low-pass filter, and an output terminal; and a first transistor, wherein the first transistor has a control terminal coupled to the output terminal of the first NAND gate, a first terminal coupled to a supply voltage, and a second terminal coupled to the current supply node.

In some embodiments, the first low-pass filter includes: a first resistor, wherein the first resistor has a first terminal for receiving the up control signal, and a second terminal coupled to the second terminal of the first low-pass filter; and a first capacitor, wherein the first capacitor has a first terminal coupled to the second terminal of the first low-pass filter, and a second terminal coupled to a ground voltage, wherein the second low-pass filter includes: a second resistor, wherein the second resistor has a first terminal for receiving the inverted down control signal, and a second terminal coupled to the second terminal of the second low-pass filter; and a second capacitor, wherein the second capacitor has a first terminal coupled to the second terminal of the second low-pass filter, and a second terminal coupled to the ground voltage.

In some embodiments, the adaptive current source includes a phase error reduction circuit reducing a phase error between the up control signal and the down control signal due to a mismatch between the first current and the second current.

In some embodiments, the phase error reduction circuit includes: a second NAND gate, wherein the second NAND gate has a first input terminal for receiving the up control signal, a second input terminal for receiving an inverted down control signal, and an output terminal, wherein the inverted down control signal has a complementary logic level to that of the down control signal; and a second transistor, wherein the second transistor has a control terminal coupled to the output terminal of the second NAND gate, a first terminal coupled to a supply voltage, and a second terminal coupled to the current supply node.

In some embodiments, the adaptive current sink includes a fast-locking circuit drawing current from the switching circuit during a locking process of a phase-locked loop (PLL), and not drawing current from the switching circuit once the PLL is locked.

In some embodiments, the fast-locking circuit includes: a third low-pass filter, wherein the third low-pass filter has a first terminal for receiving the down control signal, and a second terminal for outputting the down control signal with reduced pulse width; a fourth low-pass filter, wherein the fourth low-pass filter has a first terminal for receiving an inverted up control signal, and a second terminal for outputting the inverted up control signal with reduced pulse width, wherein the inverted up control signal has a complementary logic level to that of the up control signal; a first AND gate, wherein the first AND gate has a first input terminal coupled to the second terminal of the third low-pass filter, a second input terminal coupled to the second terminal of the fourth low-pass filter, and an output terminal; and a third transistor, wherein the third transistor has a control terminal coupled to the output terminal of the first AND gate, a first terminal coupled to a ground voltage, and a second terminal coupled to the current sink node.

In some embodiments, the third low-pass filter includes: a third resistor, wherein the third resistor has a first terminal for receiving the down control signal, and a second terminal coupled to the second terminal of the third low-pass filter; and a third capacitor, wherein the third capacitor has a first terminal coupled to the second terminal of the third low-pass filter, and a second terminal coupled to the ground voltage, wherein the second low-pass filter includes: a fourth resistor, wherein the fourth resistor has a first terminal for receiving the inverted up control signal, and a second terminal coupled to the second terminal of the fourth low-pass filter; and a fourth capacitor, wherein the fourth capacitor has a first terminal coupled to the second terminal of the fourth low-pass filter, and a second terminal coupled to the ground voltage.

In some embodiments, the adaptive current sink includes a phase error reduction circuit reducing a phase error between the up control signal and the down control signal due to a mismatch between the first current and the second current.

In some embodiments, the phase error reduction circuit includes: a second AND gate, wherein the second AND gate has a first input terminal for receiving the down control signal, a second input terminal for receiving an inverted up control signal, and an output terminal, wherein the inverted up control signal has a complementary logic level to that of the up control signal; and a fourth transistor, wherein the fourth transistor has a control terminal coupled to the output terminal of the second AND gate, a first terminal coupled to a ground voltage, and a second terminal coupled to the current sink node.

In some embodiments, the switching circuit includes: a fifth transistor, wherein the fifth transistor has a control terminal for receiving the up control signal, a first terminal coupled to the current supply node, and a second terminal; a sixth transistor, wherein the sixth transistor has a control terminal for receiving an inverted up control signal, a first terminal coupled to the current supply node, and a second terminal coupled to the output node; a seventh transistor, wherein the seventh transistor has a control terminal for receiving an inverted down control signal, a first terminal coupled to the current sink node, and a second terminal coupled to the second terminal of the fifth transistor; an eighth transistor, wherein the eighth transistor has a control terminal for receiving the down control signal, a first terminal coupled to the current sink node, and a second terminal coupled to the output node; and a unit gain voltage follower, wherein the unit gain voltage follower has an input terminal coupled to the output node, and an output terminal coupled to the second terminal of the fifth transistor.

In some embodiments, the constant current source includes: a ninth transistor, wherein the ninth transistor has a control terminal, a first terminal coupled to a supply voltage, and a second terminal coupled to the current supply node; a tenth transistor, wherein the tenth transistor has a control terminal coupled to the control terminal of the ninth transistor, a first terminal coupled to the supply voltage, and a second terminal coupled to the control terminal; and a reference current sink, drawing a fifth current from the second terminal of the tenth transistor.

In some embodiments, the constant current sink includes: an eleventh transistor, wherein the eleventh transistor has a control terminal, a first terminal coupled to a ground voltage, and a second terminal coupled to the current sink node; a twelfth transistor, wherein the twelfth transistor has a control terminal coupled to the control terminal of the eleventh transistor, a first terminal coupled to the ground voltage, and a second terminal coupled to the control terminal; and a reference current source, supplying a sixth current to the second terminal of the twelfth transistor.

In some embodiments, the switching circuit includes: a thirteenth transistor, wherein the thirteenth transistor has a control terminal for receiving an inverted up control signal, a first terminal coupled to the current supply node, and a second terminal coupled to the output node; and a fourteenth transistor, wherein the fourteenth transistor has a control terminal for receiving the down control signal, a first terminal coupled to the current sink node, and a second terminal coupled to the output node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
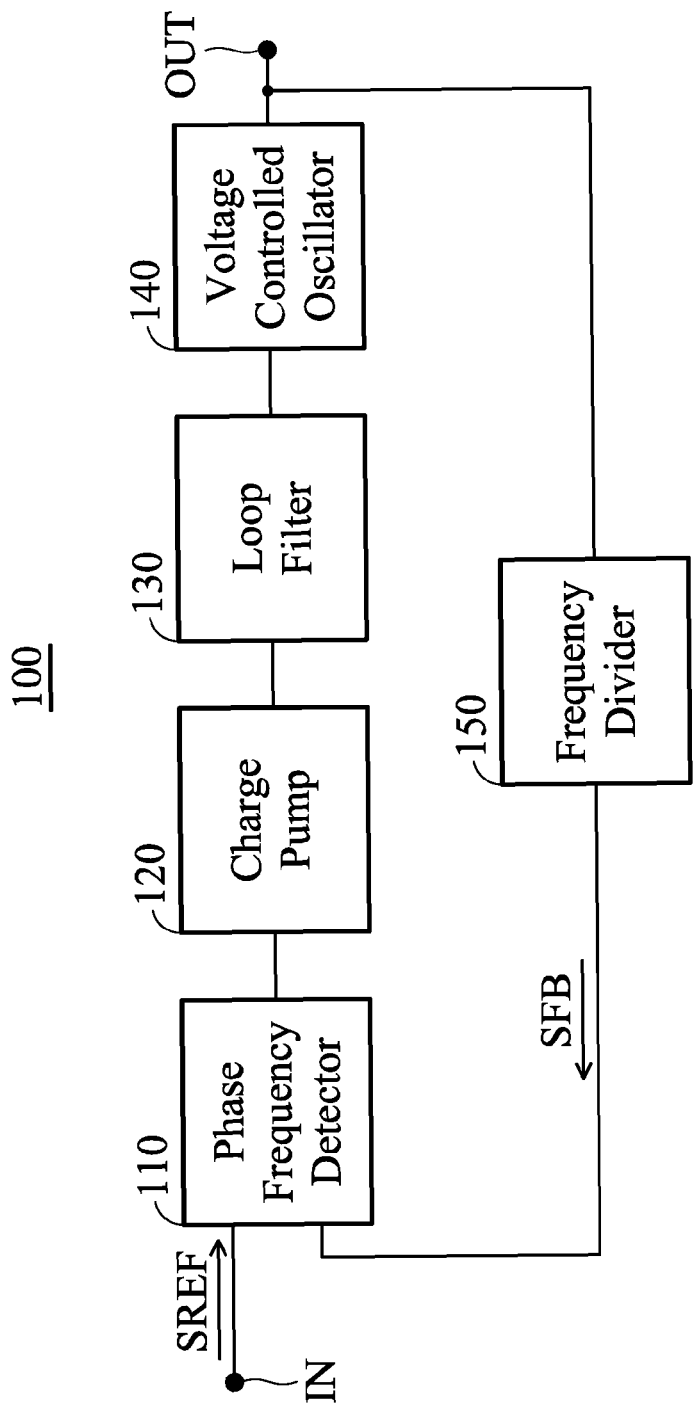
FIG. 1 is a diagram of a conventional PLL (Phase-Locked Loop) with an input node and an output node.
Figure 2:
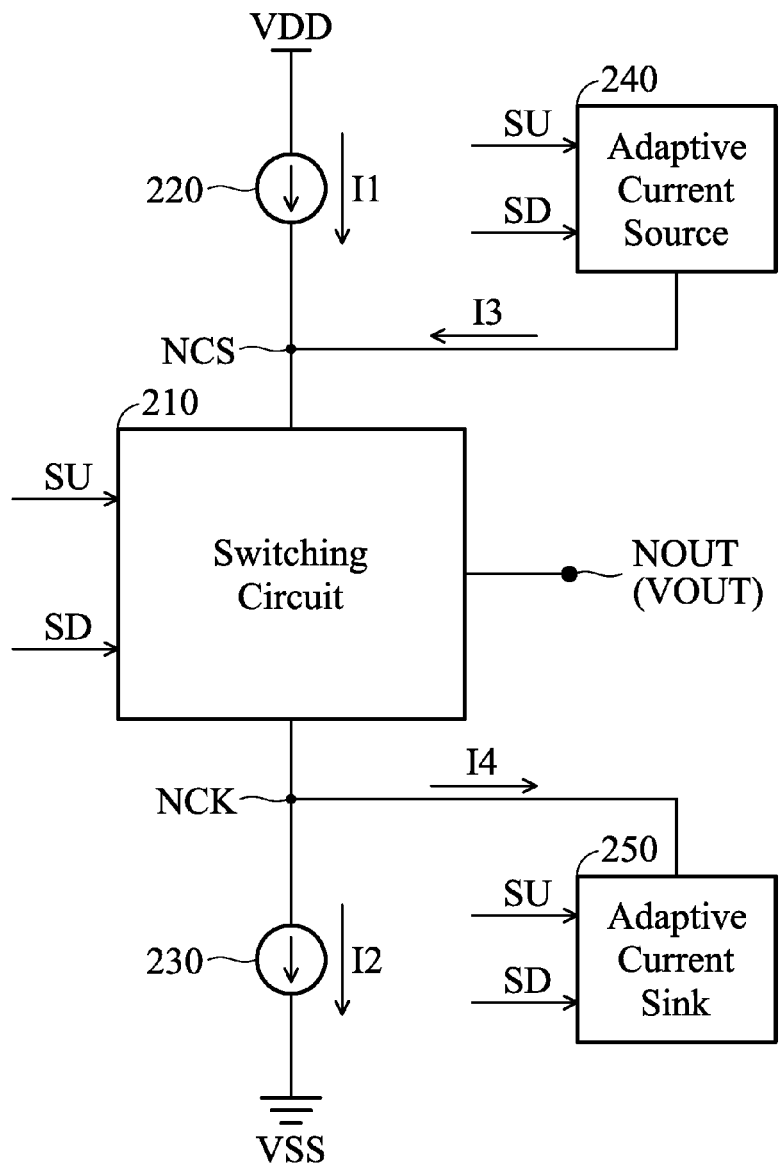
FIG. 2 is a diagram of a charge pump according to an embodiment of the invention.

FIG. 2 is a diagram of a charge pump 200 according to an embodiment of the invention. The charge pump 200 may be applied in a PLL (Phase-Locked Loop). As shown in FIG. 2, the charge pump 200 includes a switching circuit 210, a constant current source 220, a constant current sink 230, an adaptive current source 240, and an adaptive current sink 250. The switching circuit 210 generates an output voltage VOUT at an output node NOUT according to an up control signal SU and a down control signal SD by supplying current to (or drawing current from) a subsequent loop filter (not shown); the loop filter may comprise components such as resistors or capacitors as understood by those skilled in art. The output voltage VOUT is increased when the up control signal SU is at high voltage level (logic "1") and decreased when the down control signal SD is at high voltage level. The type and structure of the switching circuit 210 are not limited in the invention. The up control signal SU and the down control signal SD may be generated by a phase detector or a phase frequency detector (not shown) in a previous stage of the PLL, and they are used to pull up and pull down the output voltage VOUT of the charge pump 200 to control a subsequent VCO (Voltage-Controlled Oscillator) (not shown) to modify the frequency and/or phase of a feedback signal SFEB (not shown) so that it is matched with a reference signal SREF (not shown) at the phase frequency detector. The switching circuit 210 has a current supply node NCS and a current sink node NCK. The constant current source 220 supplies a first current I1 to the current supply node NCS of the switching circuit 210. The constant current sink 230 draws a second current I2 from the current sink node NCK of the switching circuit 210. Ideally, the first current I1 and the second current I2 are the same and are substantially unchanged, yet those skilled in the art may understand that currents supplied/drawn by actual constant current sources/sinks may change non-ideally according to the voltages at the current supply node NCS/current sink node NCK. The adaptive current source 240 supplies a third current I3 to the current supply node NCS of the switching circuit 210. The adaptive current sink 250 draws a fourth current I4 from the current sink node NCK of the switching circuit 210. The third current I3 of the adaptive current source 240 and the fourth current I4 of the adaptive current sink 250 are both adjustable according to the up control signal SU and the down control signal SD, and they are used to improve the performance of the charge pump 200. Charge pumps without the adaptive current source 240 and the adaptive current sink 250 may have several shortcomings; firstly, the first current I1 and the second current I2 are required to be large to achieve fast locking of the PLL, but large I1 and I2 may also result in larger PLL bandwidth that fails to filter out jitter from the input clock signals; secondly, there may be phase error between the up control signal SU and the down control signal SD, which is due to a mismatch between I1 and I2 as the voltages at the current supply node NCS and the current sink node NCK change. Such a phase error may further result in a phase error between the feedback signal SFEB and the reference signal SREF. The detailed structure and operation of the charge pump 200 will be described in the following embodiments and figures. It should be understood these embodiments are just exemplary, rather than limitations of the invention. Those skilled in the art may be familiar with typical structures of the phase frequency detector, loop filter, and VCO, and the details are not described here.

Figure 3:
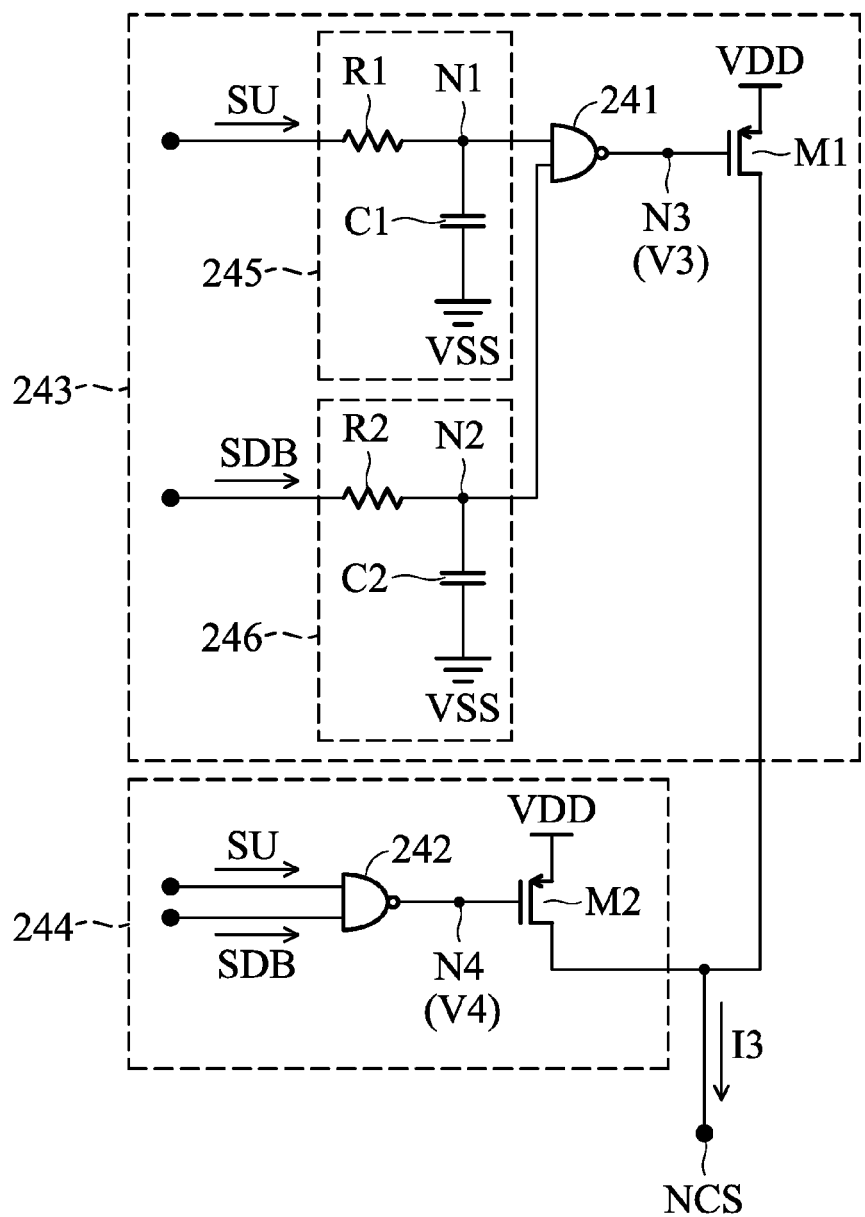
FIG. 3 is a diagram of an adaptive current source according to an embodiment of the invention.

FIG. 3 is a diagram of the adaptive current source 240 according to an embodiment of the invention. In the embodiment of FIG. 3, the adaptive current source 240 includes a fast-locking circuit 243 and a phase error reduction circuit 244 to generate the third current I3; the fast-locking circuit 243 may comprise a first low-pass filter 245, a second low-pass filter 246, a first NAND gate 241, and a first transistor M1; the phase error reduction circuit 244 may comprise a second NAND gate 242 and a second transistor M2. The first transistor M1 and the second transistor M2 may be PMOS transistors (P-type Metal Oxide Semiconductor Field Effect Transistors). In one embodiment, the first low-pass filter 245 may comprise a first resistor R1 and a first capacitor C1, and the second low-pass filter 246 may comprise a second resistor R2 and a second capacitor C2; in other embodiments, other low-pass filtering circuits well known to those skilled in the art may be used. The first resistor R1 has a first terminal for receiving the up control signal SU, and a second terminal coupled to a first node N1. The first capacitor C1 has a first terminal coupled to the first node N1, and a second terminal coupled to a ground voltage VSS. The second resistor R2 has a first terminal for receiving an inverted down control signal SDB, and a second terminal coupled to a second node N2. The second capacitor C2 has a first terminal coupled to the second node N2, and a second terminal coupled to the ground voltage VSS. The inverted down control signal SDB has a complementary logic level to that of the down control signal SD, and may be generated by using an inverter (not shown). The first NAND gate 241 has a first input terminal coupled to the first node N1, a second input terminal coupled to the second node N2, and an output terminal coupled to a third node N3. The first transistor M1 has a control terminal coupled to the third node N3, a first terminal coupled to a supply voltage VDD, and a second terminal coupled to the current supply node NCS. The second NAND gate 242 has a first input terminal for receiving the up control signal SU, a second input terminal for receiving the inverted down control signal SDB, and an output terminal coupled to a fourth node N4. The second transistor M2 has a control terminal coupled to the fourth node N4, a first terminal coupled to the supply voltage VDD, and a second terminal coupled to the current supply node NCS. In some embodiments, the size (i.e., the aspect ratio W/L) of the first transistor M1 is about 10 times the size of the second transistor M2. In some embodiments, each of the first resistor R1 and the second resistor R2 has a resistance of about 1 kΩ, and each of the first capacitor C1 and the second capacitor C2 has a capacitance of about 0.01 pF. The fast-locking circuit 243 may provide additional current to the current supply node NCS during the locking process to achieve fast locking of the PLL, and ceases to provide additional current once the PLL is locked, so that jitter from the input clock signals may be properly filtered out. During the locking process, the up control signal SU may be at high voltage level (logic "1") and the down control signal SD may be at low voltage level (logic "0") to supply current to the output node NOUT; the first low-pass filter 245 and the second low-pass filter 246 reduce the pulse widths of the corresponding up control signal SU and inverted down control signal SDB, respectively, to ensure that the fast-locking circuit 243 only provides current during the locking process. The output terminal of the first NAND gate 241 is thus at low voltage level, and the first transistor M1 is turned on to provide the additional current. When the PLL is locked, both the up control signal SU and the down control signal SD are at low voltage level (except for minor narrow peaks resulting from possible mismatch between I1 and I2, which are suppressed by the first low-pass filter 245 and the second low-pass filter 246), so that the first transistor M1 is turned off to cease to provide current. The phase error reduction circuit 244 is designed to compensate for the minor narrow peaks resulting from phase error between the up control signal SU and the down control signal SD due to mismatch between I1 and I2. The phase error reduction circuit 244 is similar to the fast-locking circuit 243 without the first low-pass filter 245 and the second low-pass filter 246, so that the minor narrow peaks in the up control signal SU and the down control signal SD are not suppressed; since the size of the second transistor M2 is only 1/10 that of the first transistor M1, the additional current provided by the second transistor M2 to compensate for phase error is relatively small, so that the PLL bandwidth is not severely affected. As can be seen from above, the fast-locking circuit 243 and the phase error reduction circuit 244 may operate independently of each other; in other embodiments, the adaptive current source 240 may comprise only the fast-locking circuit 243 or only the phase error reduction circuit 244.

Figure 4:
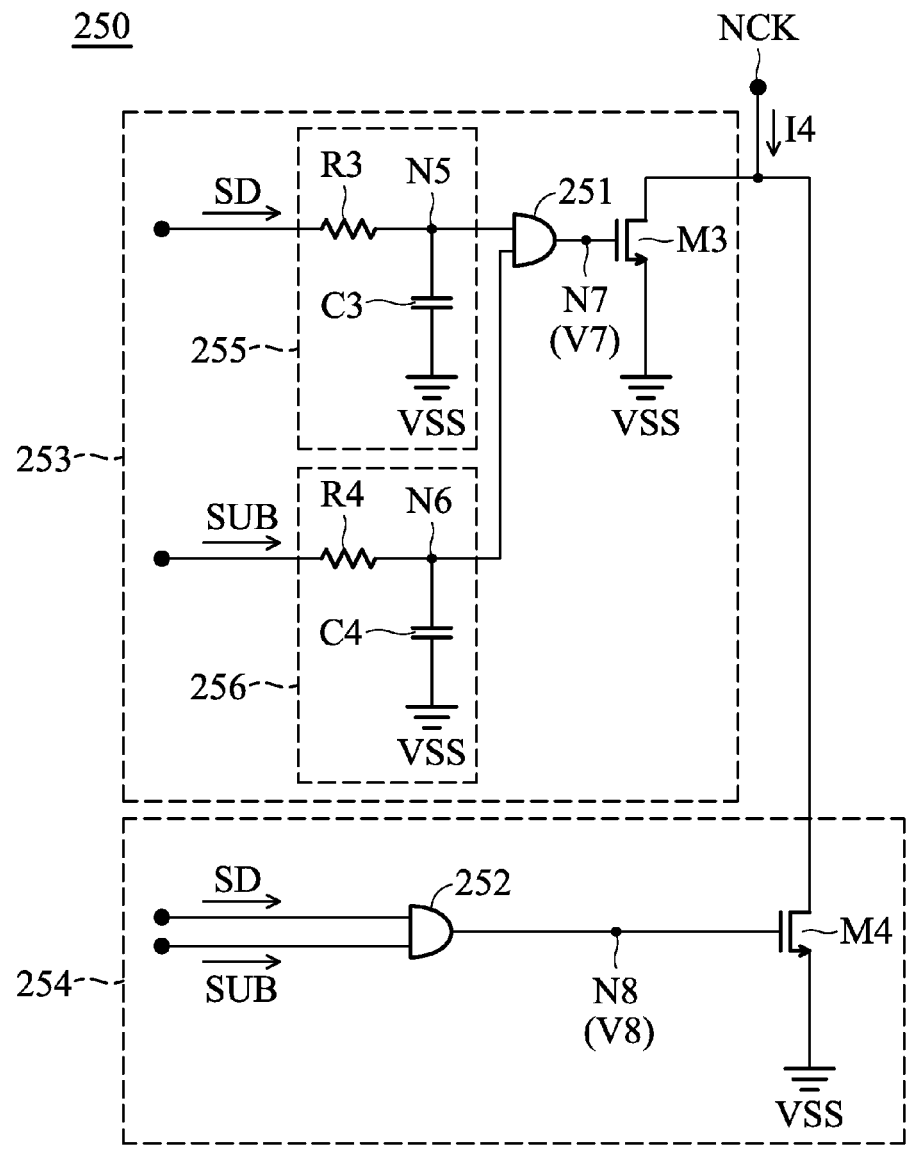
FIG. 4 is a diagram of an adaptive current sink according to an embodiment of the invention.

FIG. 4 is a diagram of the adaptive current sink 250 according to an embodiment of the invention. In the embodiment of FIG. 4, the adaptive current sink 250 includes a fast-locking circuit 253 and a phase error reduction circuit 254 to generate the fourth current I4; the fast-locking circuit 253 may comprise a third low-pass filter 255, a fourth low-pass filter 256, a first AND gate 251, and a third transistor M3; the phase error reduction circuit 254 may comprise a second AND gate 252 and a fourth transistor M4. The third transistor M3 and the fourth transistor M4 may be NMOS transistors (N-type Metal Oxide Semiconductor Field Effect Transistors). In one embodiment, the third low-pass filter 255 may comprise a third resistor R3 and a third capacitor C3, and the fourth low-pass filter 256 may comprise a fourth resistor R4 and a fourth capacitor C4; in other embodiments, other low-pass filtering circuits well known to those skilled in the art may be used. The third resistor R3 has a first terminal for receiving the down control signal SD, and a second terminal coupled to a fifth node N5. The third capacitor C3 has a first terminal coupled to the fifth node N5, and a second terminal coupled to the ground voltage VSS. The fourth resistor R4 has a first terminal for receiving an inverted up control signal SUB, and a second terminal coupled to a sixth node N6. The fourth capacitor C4 has a first terminal coupled to the sixth node N6, and a second terminal coupled to the ground voltage VSS. The inverted up control signal SUB has a complementary logic level to that of the up control signal SU, and may be generated by using an inverter (not shown). The first AND gate 251 has a first input terminal coupled to the fifth node N5, a second input terminal coupled to the sixth node N6, and an output terminal coupled to a seventh node N7. The third transistor M3 has a control terminal coupled to the seventh node N7, a first terminal coupled to the ground voltage VSS, and a second terminal coupled to the current sink node NCK. The second AND gate 252 has a first input terminal for receiving the down control signal SD, a second input terminal for receiving the inverted up control signal SUB, and an output terminal coupled to an eighth node N8. The fourth transistor M4 has a control terminal coupled to the eight node N8, a first terminal coupled to the ground voltage VSS, and a second terminal coupled to the current sink node NCK. In some embodiments, the size (i.e., the aspect ratio W/L) of the third transistor M3 is about 10 times the size of the fourth transistor M4. In some embodiments, each of the third resistor R3 and the fourth resistor R4 has a resistance of about 1 kΩ, and each of the third capacitor C3 and the fourth capacitor C4 has a capacitance of about 0.01 pF. The operating principles of the fast-locking circuit 253 and the phase error reduction circuit 254 are similar with those of the fast-locking circuit 243 and the phase error reduction circuit 244, with the polarities of certain signals and components changed to suit the current-drawing properties of the adaptive current sink 250. Similarly, the fast-locking circuit 253 and the phase error reduction circuit 254 may operate independently of each other; in other embodiments, the adaptive current sink 250 may comprise only the fast-locking circuit 253 or only the phase error reduction circuit 254.

Figure 5:
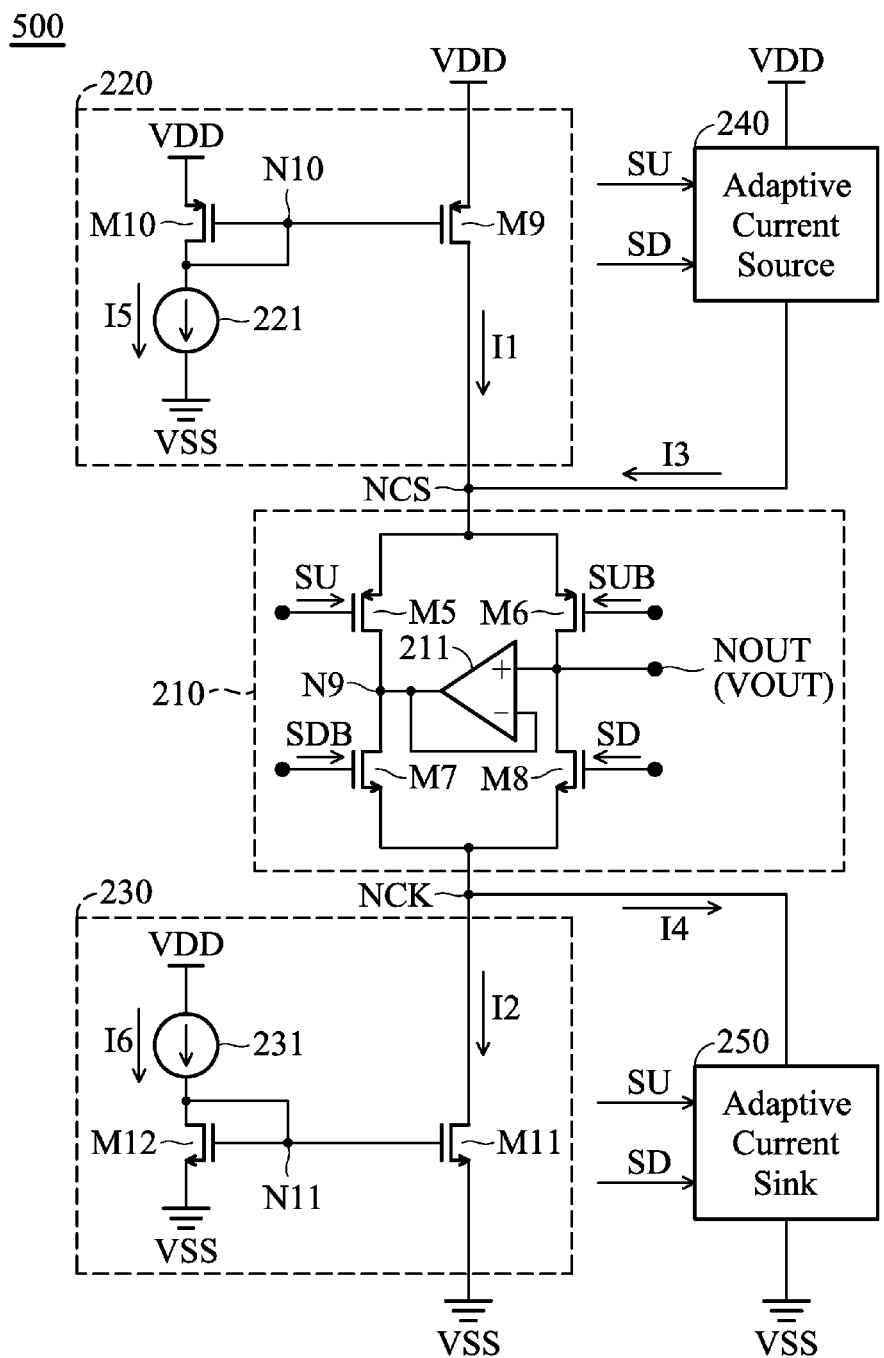
FIG. 5 is a diagram of a charge pump according to an embodiment of the invention.

FIG. 5 is a diagram of a charge pump 500 according to an embodiment of the invention. In the embodiment of FIG. 5, the switching circuit 210 of the charge pump 500 includes a fifth transistor M5, a sixth transistor M6, a seventh transistor M7, an eighth transistor M8, and a unit gain voltage follower 211. The fifth transistor M5 and the sixth transistor M6 may be PMOS transistors. The seventh transistor M7 and the eighth transistor M8 may be NMOS transistors. The fifth transistor M5 has a control terminal for receiving the up control signal SU, a first terminal coupled to the current supply node NCS, and a second terminal coupled to a ninth node N9. The sixth transistor M6 has a control terminal for receiving the inverted up control signal SUB, a first terminal coupled to the current supply node NCS, and a second terminal coupled to an output node NOUT of the charge pump 500. The seventh transistor M7 has a control terminal for receiving the inverted down control signal SDB, a first terminal coupled to the current sink node NCK, and a second terminal coupled to the ninth node N9. The eighth transistor M8 has a control terminal for receiving the down control signal SD, a first terminal coupled to the current sink node NCK, and a second terminal coupled to the output node NOUT. The unit gain voltage follower 211 has an input terminal coupled to the output node NOUT, and an output terminal coupled to the ninth node N9. The sixth transistor M6 may supply the current flowing into the current supply node NCS (which may include the first current I1 and the third current I3 during locking process) to the output node NOUT when the up control signal SU is at high voltage level (i.e., when the inverted up control signal SUB is at low voltage level), and the eighth transistor M8 may draw the current flowing out of the current sink node NCK (which may include the second current I2 and the fourth current I4 during locking process) from the output node NOUT when the down control signal SD is at high voltage level. When the up control signal SU is at low voltage level, the fifth transistor M5 injects the current flowing into the current supply node NCS into the ninth node N9, and the unit gain voltage follower 211 keeps the voltage at the current supply node NCS to be equal with VOUT; when the down control signal SD is at low voltage level, the seventh transistor M7 extracts the current flowing out of the current sink node NCK from the ninth node N9, and the unit gain voltage follower 211 keeps the voltage at the current sink node NCK to be equal with VOUT.

The constant current source 220 of the charge pump 500 includes a ninth transistor M9, a tenth transistor M10, and a reference current sink 221. The ninth transistor M9 and the tenth transistor M10 may be PMOS transistors. The ninth transistor M9 has a control terminal coupled to a tenth node N10, a first terminal coupled to the supply voltage VDD, and a second terminal coupled to the current supply node NCS. The tenth transistor M10 has a control terminal coupled to the tenth node N10, a first terminal coupled to the supply voltage VDD, and a second terminal coupled to the tenth node N10. The reference current sink 221 draws a fifth current I5 from the tenth node N10. In some embodiments, the size (i.e., the aspect ratio W/L) of the ninth transistor M9 is about 3.3 times the size of the second transistor M2 of the adaptive current source 240. The constant current sink 230 of the charge pump 500 includes an eleventh transistor M11, a twelfth transistor M12, and a reference current source 231. The eleventh transistor M11 and the twelfth transistor M12 may be NMOS transistors. The eleventh transistor M11 has a control terminal coupled to an eleventh node N11, a first terminal coupled to the ground voltage VSS, and a second terminal coupled to the current sink node NCK. The twelfth transistor M12 has a control terminal coupled to the eleventh node N11, a first terminal coupled to the ground voltage VSS, and a second terminal coupled to the eleventh node N11. The reference current source 231 supplies a sixth current I6 to the eleventh node N11. In some embodiments, the size (i.e., the aspect ratio W/L) of the eleventh transistor M11 is about 3.3 times the size of the fourth transistor M4 of the adaptive current sink 250. Those skilled in the art may use other circuit structures for the constant current source 220 and the constant current sink 230.

Please refer to FIGS. 1 to 5 to understand the operation theory of the invention. The proposed charge pump 100 (500) may be applied in a corresponding PLL. The adaptive current source 240 and the adaptive current sink 250 can provide additional charging and discharging currents for the charge pump 100 (500) during locking, and therefore they can accelerate the locking process of the PLL without affecting the PLL bandwidth. Furthermore, the adaptive current source 240 and the adaptive current sink 250 can continuously fine-tune the output voltage VOUT of the charge pump 100 (500) until the up control signal SU and the down control signal SD are correctly aligned with each other, and therefore they can reduce the phase error of the PLL. Specifically, in the adaptive current source 240, the large-size first transistor M1 is configured to speed up the locking process, and the small-size second transistor M2 is configured to continuously eliminate the phase error; and in the adaptive current sink 250, the large-size third transistor M3 is configured to speed up the locking process, and the small-size fourth transistor M4 is configured to continuously eliminate the phase error.

Figure 6:
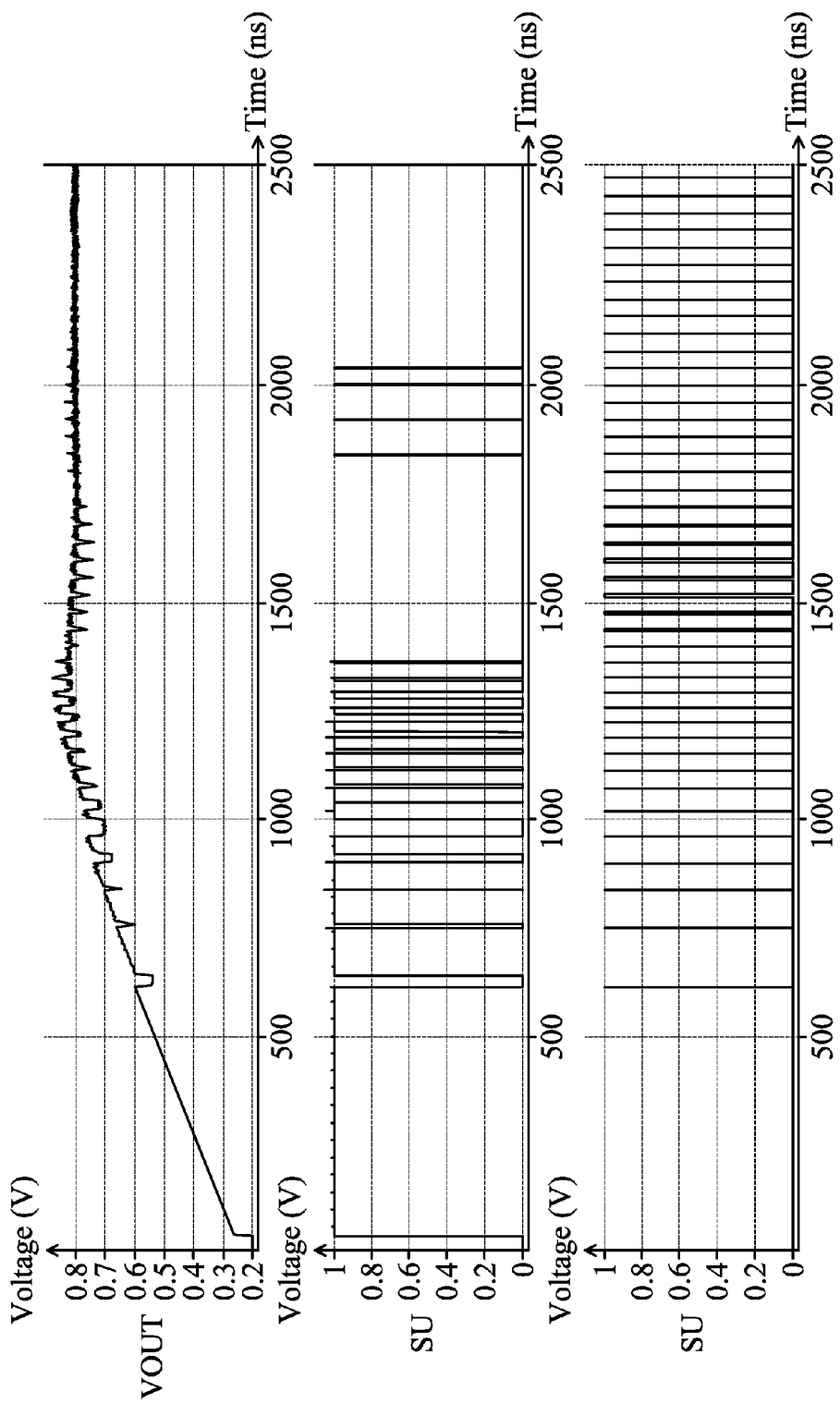
FIG. 6 is a diagram of signal waveforms of a conventional charge pump without any adaptive current source/sink.

FIG. 6 is a diagram of signal waveforms of a conventional charge pump without any adaptive current source/sink. The horizontal axis represents time (ns), and the vertical axis represents voltage (V). It is assumed that the conventional charge pump is used in a PLL, and initially the frequency of the PLL feedback signal SFB is lower than the frequency of the PLL reference signal SREF (unlocked). According to the simulation result of FIG. 6, the PLL with the conventional charge pump has a locking time of about 2000 ns, and has a phase error (expressed as the difference between the rising edges of the feedback signal SFEB and the reference signal SREF in units of time) of about 200 ps.

Figure 7:
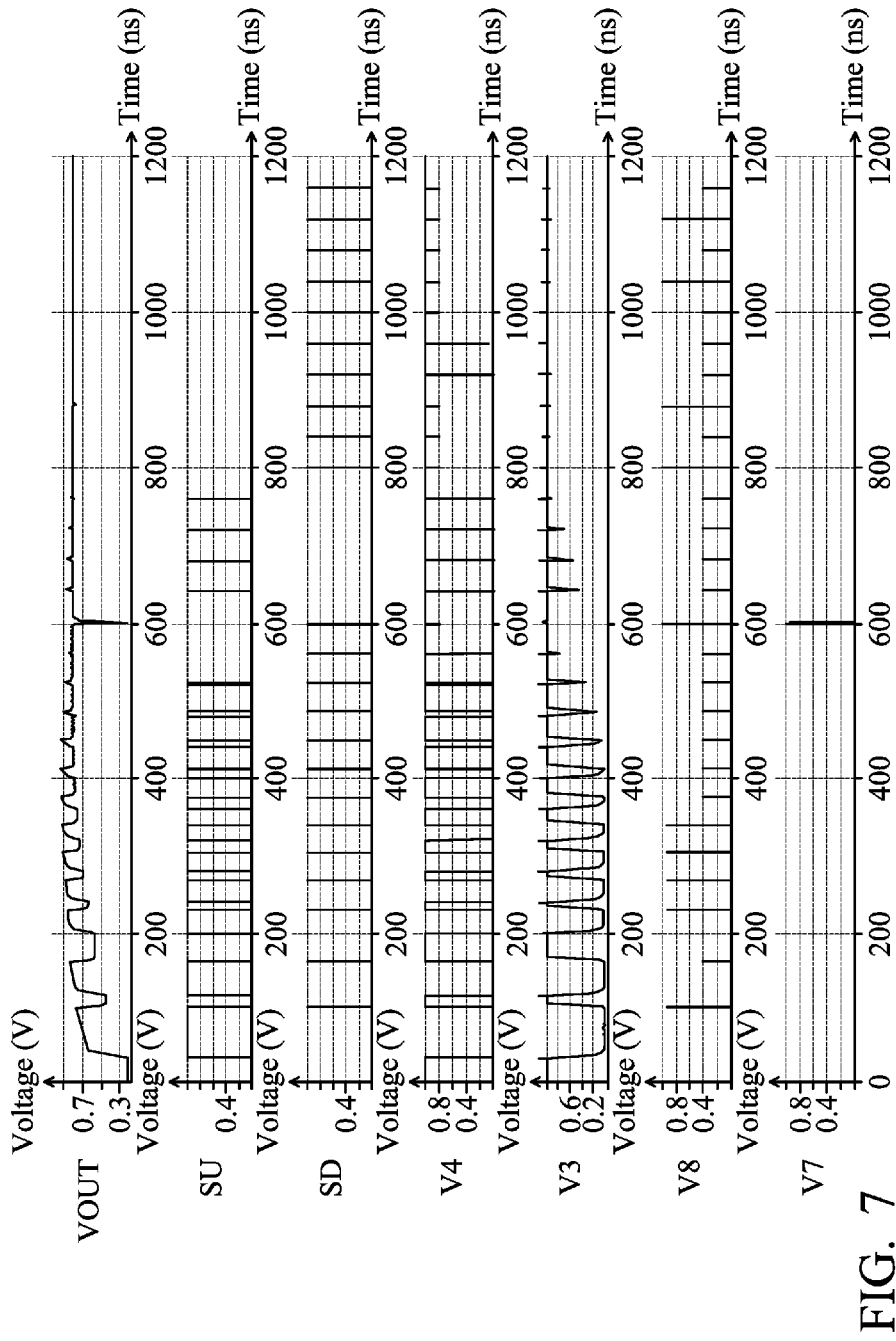
FIG. 7 is a diagram of signal waveforms of the proposed charge pump with an adaptive current source and an adaptive current sink according to an embodiment of the invention.

FIG. 7 is a diagram of signal waveforms of the proposed charge pump 100 (500) with the adaptive current source 240 and the adaptive current sink 250 according to an embodiment of the invention. The horizontal axis represents time (ns), and the vertical axis represents voltage (V). It is assumed that the charge pump 100 (500) is used in a PLL, and initially the frequency of the PLL feedback signal SFB is lower than the frequency of the PLL reference signal REF (unlocked). Please refer to FIG. 3, FIG. 4, and FIG. 7 together. The voltage V3, the voltage V4, the voltage V7, and the voltage V8 are respectively arranged for controlling the first transistor M1, the second transistor M2, the third transistor M3, and the fourth transistor M4, so as to provide additional charging/discharging currents for the charge pump 100 (500) and accelerate the locking process of the PLL. After the locking process of the PLL is completed, the voltage V3 and the voltage V7 gradually become a stable logic level, such that the large-size first transistor M1 and the large-size third transistor M3 are both disabled (i.e., turned off). Then, the small-size second transistor M2 and the small-size fourth transistor M4 can continuously fine-tune the phase error between the PLL feedback signal SFB and the PLL reference signal SREF. For example, even if the constant current source 220 mismatches with the constant current sink 230 and the first current I1 is not equal to the second current I2, the generated PLL phase error can be continuously eliminated by the adaptive current source 240 and the adaptive current sink 250. According to the simulation result of FIG. 7, the PLL with the proposed charge pump 100 (500) has a locking time of about 800 ns, and has a phase error of about 1 Ops. As a result, the proposed design can significantly improve the locking time, jitter, and phase error of the charge pump 100 (500) and the corresponding PLL. The invention is insensitive to PVT (Process, Voltage, and Temperature) variations, and it is suitable for application in a variety of PLL circuits.

Figure 8:
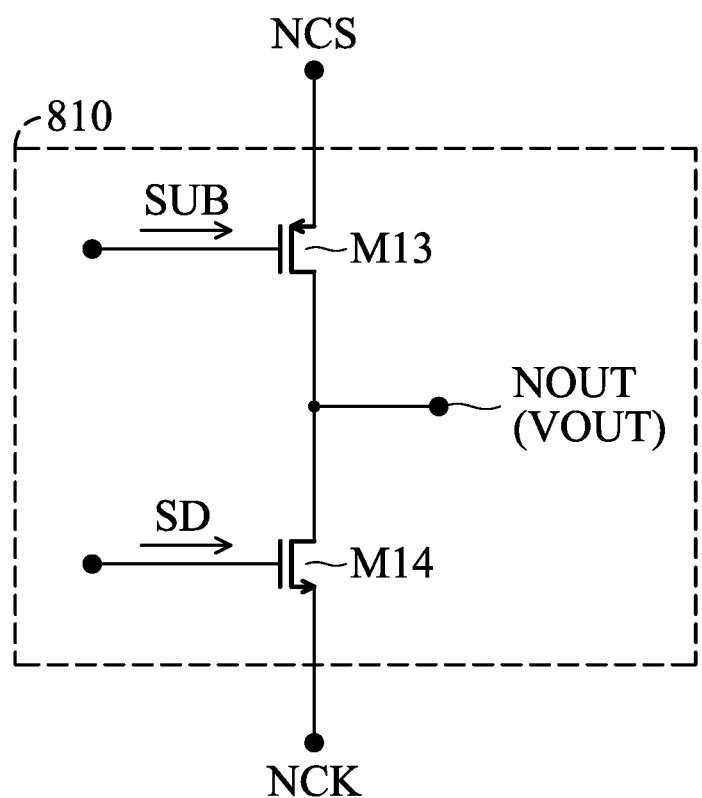
FIG. 8 is a diagram of a switching circuit according to another embodiment of the invention.

FIG. 8 is a diagram of a switching circuit 810 according to another embodiment of the invention. The switching circuit 810 may be applied in the charge pump 100 (500). In the embodiment of FIG. 8, the switching circuit 810 includes a thirteenth transistor M13 and a fourteenth transistor M14. The thirteenth transistor M13 may be a PMOS transistor, and the fourteenth transistor M14 may be an NMOS transistor. The thirteenth transistor M13 has a control terminal for receiving the inverted up control signal SUB, a first terminal coupled to the current supply node NCS, and a second terminal coupled to the output node NOUT. The fourteenth transistor M14 has a control terminal for receiving the down control signal SD, a first terminal coupled to the current sink node NCK, and a second terminal coupled to the output node NOUT. The function of the switching circuit 810 is similar to that of the sixth transistor M6 and the eighth transistor M8 of the switching circuit 210 described in the embodiment of FIG. 5. In other embodiments, other types of switching circuits well known to those skilled in the art may be used.

Note that the above signal voltages, currents, resistances, and other element parameters are not limitations of the invention. A designer can adjust these parameters according to different requirements. The charge pump of the invention is not limited to the configurations of FIGS. 1-8. The invention may merely include any one or more features of any one or more embodiments of FIGS. 1-8. In other words, not all of the features displayed in the figures should be implemented in the charge pump of the invention. Although the invention is mainly described using application in PLL as an example, the disclosed charge pumps of the invention may also be used in other applications that require charge pumps, such as voltage doubler circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with a true scope of the disclosed embodiments being indicated by the following claims and their equivalents.

What is claimed is:

1. A charge pump, comprising:
a switching circuit, generating an output voltage at an output node according to an up control signal and a down control signal, wherein the output voltage is increased when the up control signal is at high voltage level and decreased when the down control signal is at high voltage level;
a constant current source, supplying a first current to the switching circuit at a current supply node;
a constant current sink, drawing a second current from the switching circuit at a current sink node;
an adaptive current source, supplying a third current to the switching circuit at the current supply node; and
an adaptive current sink, drawing a fourth current from the switching circuit at the current sink node;
wherein the third current and the fourth current are adjustable according to the up control signal and the down control signal.

2. The charge pump as claimed in claim 1, wherein the adaptive current source comprises a fast-locking circuit supplying current to the switching circuit during a locking process of a phase-locked loop (PLL), and not supplying current to the switching circuit once the PLL is locked.

3. The charge pump as claimed in claim 2, wherein the fast-locking circuit comprises:
   a first low-pass filter, wherein the first low-pass filter has a first terminal for receiving the up control signal, and a second terminal for outputting the up control signal with reduced pulse width;
   a second low-pass filter, wherein the second low-pass filter has a first terminal for receiving an inverted down control signal, and a second terminal for outputting the inverted down control signal with reduced pulse width, wherein the inverted down control signal has a complementary logic level to that of the down control signal;
   a first NAND gate, wherein the first NAND gate has a first input terminal coupled to the second terminal of the first low-pass filter, a second input terminal coupled to the second terminal of the second low-pass filter, and an output terminal; and
   a first transistor, wherein the first transistor has a control terminal coupled to the output terminal of the first NAND gate, a first terminal coupled to a supply voltage, and a second terminal coupled to the current supply node.

4. The charge pump as claimed in claim 3, wherein the first low-pass filter comprises:
   a first resistor, wherein the first resistor has a first terminal for receiving the up control signal, and a second terminal coupled to the second terminal of the first low-pass filter; and
   a first capacitor, wherein the first capacitor has a first terminal coupled to the second terminal of the first low-pass filter, and a second terminal coupled to a ground voltage,
   wherein the second low-pass filter comprises:
   a second resistor, wherein the second resistor has a first terminal for receiving the inverted down control signal, and a second terminal coupled to the second terminal of the second low-pass filter; and
   a second capacitor, wherein the second capacitor has a first terminal coupled to the second terminal of the second low-pass filter, and a second terminal coupled to the ground voltage.

5. The charge pump as claimed in claim 1, wherein the adaptive current source comprises a phase error reduction circuit reducing a phase error between the up control signal and the down control signal due to a mismatch between the first current and the second current.

6. The charge pump as claimed in claim 5, wherein the phase error reduction circuit comprises:
   a second NAND gate, wherein the second NAND gate has a first input terminal for receiving the up control signal, a second input terminal for receiving an inverted down control signal, and an output terminal, wherein the inverted down control signal has a complementary logic level to that of the down control signal; and
   a second transistor, wherein the second transistor has a control terminal coupled to the output terminal of the second NAND gate, a first terminal coupled to a supply voltage, and a second terminal coupled to the current supply node.

7. The charge pump as claimed in claim 1, wherein the adaptive current sink comprises a fast-locking circuit drawing current from the switching circuit during a locking process of a phase-locked loop (PLL), and not drawing current from the switching circuit once the PLL is locked.

8. The charge pump as claimed in claim 7, wherein the fast-locking circuit comprises:
   a third low-pass filter, wherein the third low-pass filter has a first terminal for receiving the down control signal, and a second terminal for outputting the down control signal with reduced pulse width;
   a fourth low-pass filter, wherein the fourth low-pass filter has a first terminal for receiving an inverted up control signal, and a second terminal for outputting the inverted up control signal with reduced pulse width, wherein the inverted up control signal has a complementary logic level to that of the up control signal;
   a first AND gate, wherein the first AND gate has a first input terminal coupled to the second terminal of the third low-pass filter, a second input terminal coupled to the second terminal of the fourth low-pass filter, and an output terminal; and
   a third transistor, wherein the third transistor has a control terminal coupled to the output terminal of the first AND gate, a first terminal coupled to a ground voltage, and a second terminal coupled to the current sink node.

9. The charge pump as claimed in claim 8, wherein the third low-pass filter comprises:
   a third resistor, wherein the third resistor has a first terminal for receiving the down control signal, and a second terminal coupled to the second terminal of the third low-pass filter; and
   a third capacitor, wherein the third capacitor has a first terminal coupled to the second terminal of the third low-pass filter, and a second terminal coupled to the ground voltage,
   wherein the second low-pass filter comprises:
   a fourth resistor, wherein the fourth resistor has a first terminal for receiving the inverted up control signal, and a second terminal coupled to the second terminal of the fourth low-pass filter; and
   a fourth capacitor, wherein the fourth capacitor has a first terminal coupled to the second terminal of the fourth low-pass filter, and a second terminal coupled to the ground voltage.

10. The charge pump as claimed in claim 1, wherein the adaptive current sink comprises a phase error reduction circuit reducing a phase error between the up control signal and the down control signal due to a mismatch between the first current and the second current.

11. The charge pump as claimed in claim 10, wherein the phase error reduction circuit comprises:
   a second AND gate, wherein the second AND gate has a first input terminal for receiving the down control signal, a second input terminal for receiving an inverted up control signal, and an output terminal, wherein the inverted up control signal has a complementary logic level to that of the up control signal; and
   a fourth transistor, wherein the fourth transistor has a control terminal coupled to the output terminal of the second AND gate, a first terminal coupled to a ground voltage, and a second terminal coupled to the current sink node.

12. The charge pump as claimed in claim 1, wherein the switching circuit comprises:
   a fifth transistor, wherein the fifth transistor has a control terminal for receiving the up control signal, a first terminal coupled to the current supply node, and a second terminal;
   a sixth transistor, wherein the sixth transistor has a control terminal for receiving an inverted up control signal, a first terminal coupled to the current supply node, and a second terminal coupled to the output node;

a seventh transistor, wherein the seventh transistor has a control terminal for receiving an inverted down control signal, a first terminal coupled to the current sink node, and a second terminal coupled to the second terminal of the fifth transistor;

an eighth transistor, wherein the eighth transistor has a control terminal for receiving the down control signal, a first terminal coupled to the current sink node, and a second terminal coupled to the output node; and a unit gain voltage follower, wherein the unit gain voltage follower has an input terminal coupled to the output node, and an output terminal coupled to the second terminal of the fifth transistor.

13. The charge pump as claimed in claim 1, wherein the constant current source comprises:

a ninth transistor, wherein the ninth transistor has a control terminal, a first terminal coupled to a supply voltage, and a second terminal coupled to the current supply node;

a tenth transistor, wherein the tenth transistor has a control terminal coupled to the control terminal of the ninth transistor, a first terminal coupled to the supply voltage, and a second terminal coupled to the control terminal; and a reference current sink, drawing a fifth current from the second terminal of the tenth transistor.

14. The charge pump as claimed in claim 1, wherein the constant current sink comprises:

an eleventh transistor, wherein the eleventh transistor has a control terminal, a first terminal coupled to a ground voltage, and a second terminal coupled to the current sink node;

a twelfth transistor, wherein the twelfth transistor has a control terminal coupled to the control terminal of the eleventh transistor, a first terminal coupled to the ground voltage, and a second terminal coupled to the control terminal; and a reference current source, supplying a sixth current to the second terminal of the twelfth transistor.

15. The charge pump as claimed in claim 1, wherein the switching circuit comprises:

a thirteenth transistor, wherein the thirteenth transistor has a control terminal for receiving an inverted up control signal, a first terminal coupled to the current supply node, and a second terminal coupled to the output node; and a fourteenth transistor, wherein the fourteenth transistor has a control terminal for receiving the down control signal, a first terminal coupled to the current sink node, and a second terminal coupled to the output node.

* * * * *